United States Patent [19]

Worlock

[11] 4,250,516

[45] Feb. 10, 1981

[54] MULTISTAGE AVALANCHE PHOTODETECTOR

[75] Inventor: John M. Worlock, Fair Haven, N.J.

[73] Assignee: Bell Telephone Laboratories, Incorporated, Murray Hill, N.J.

[21] Appl. No.: 64,040

[22] Filed: Aug. 6, 1979

[51] Int. Cl.³ .......................................... H01L 29/16
[52] U.S. Cl. ...................................... 357/16; 357/13; 357/30
[58] Field of Search ............................ 357/16, 30, 13

[56] References Cited

U.S. PATENT DOCUMENTS

| | | | |
|---|---|---|---|
| 3,982,261 | 9/1976 | Antypas | 357/16 |
| 4,103,312 | 7/1978 | Chang | 357/16 |
| 4,127,862 | 11/1978 | Ilegems | 357/30 |
| 4,163,237 | 7/1979 | Dingle | 357/16 |
| 4,179,702 | 12/1979 | Lamorte | 357/30 |

OTHER PUBLICATIONS

McIntyre, *IEEE Trans. on Electron Devices*, vol. ed. 13, No. 1, Jan. 1966.

*Primary Examiner*—Martin H. Edlow
*Attorney, Agent, or Firm*—Michael B. Einschlag

[57] ABSTRACT

A low noise multistage photodetector device is formed from a sequence of pairs of layers of opposite conductivity type having heterojunctions between each pair. The second layer of each pair has a bandgap which is larger than the bandgap of the first layer of the pair adjacent to the second layer. Electrodes are formed on the device so that voltages may be applied to reverse bias the heterojunctions formed between each pair in the sequence and to forward bias the heterojunctions formed between the second layer of one pair and the first layer of another pair. The device provides traps for one sign of carrier, which traps prevent the trapped carrier from avalanching through amplification regions of the device.

22 Claims, 9 Drawing Figures

MULTISTAGE AVALANCHE PHOTODETECTOR

BACKGROUND OF THE INVENTION

The invention relates to photodetectors and particularly to the field of avalanche photodetectors.

The noise factor of an avalanche photodetector, a measure of the noise degradation of the photodetector as compared to that of an ideal noiseless amplifier, increases considerably with the avalanche gain. In an avalanche photodiode the noise factor of the carrier multiplication process depends both on the ratio between the ionization coefficients (the ionization probability per unit length) for electrons and for holes and on the mechanism which initiates the carrier multiplication. A large difference between ionization coefficients for electrons and holes is beneficial for low noise provided the avalanche mechanism is initiated by the carrier type, electron or hole, having the higher ionization coefficient.

Although silicon exhibits a very large difference between the ionization coefficients of electrons and holes, (especially at low fields), the response of silicon devices to photons does not extend much beyond 1.1 microns; being basically limited by the 1.12 eV bandgap energy of the silicon.

Germanium avalanche photodiodes appear to be well suited for detection of photons in the wavelength range of 1.1-1.5 microns. However, germanium has almost equal electron and hole ionization coefficients which causes these devices to suffer from excess noise.

Avalanche photodiodes fabricated out of III-V semiconductor components, having radiation wavelength sensitivities which are adjustable in the region of practical interest, i.e., the low-loss spectral transmission window for optical fibers, also suffer from high noise due to the near equality of the ionization coefficients for holes and electrons.

SUMMARY OF THE INVENTION

A device constructed according to the present invention comprises a sequence of at least two pairs of contiguous layers of semiconductor material of alternating opposed types of conductivity. The second layer of each pair has a bandgap which is larger than the bandgap of the first layer of the pair adjacent to the second layer. Electrodes, formed on the device, provide connections whereby voltages applied to the electrodes give reverse bias to the heterojunctions formed in each pair in the sequence of pairs of layers and forward bias to the heterojunctions formed between the second layer of one pair and the first layer of another pair. The effect of biasing the device as described above is to form traps for one sign of carrier. These traps prevent that carrier from avalanching through the several stages of amplification in the device (where a single stage of amplication is defined by a single pair of layers). The electrodes also serve to drain the traps of accumulated carriers which cannot then avalanche through the several stages of amplification.

BRIEF DESCRIPTION OF THE DRAWING

A complete understanding of the present invention and of the above and other objects thereof may be gained from a consideration of the following detailed description presented hereinbelow in connection with the accompanying drawings in which.

DETAILED DESCRIPTION

An avalanche photodetector constructed according to the present invention comprises a sequence of at least four contiguous layers of semiconductor material of alternating opposed types of conductivity. Consider the layers in pairs starting from one end of the photodetector. The bandgap of the material comprising the second layer of each pair is larger than the bandgap of the material comprising the first layer of the pair of layers adjacent to the second layer when viewed in the direction from the first end to the second end of the photodetector. The effect of the multilayer device is to create traps for one sign of carrier and to prevent the trapped carrier from avalanching through the device.

Figure 1:
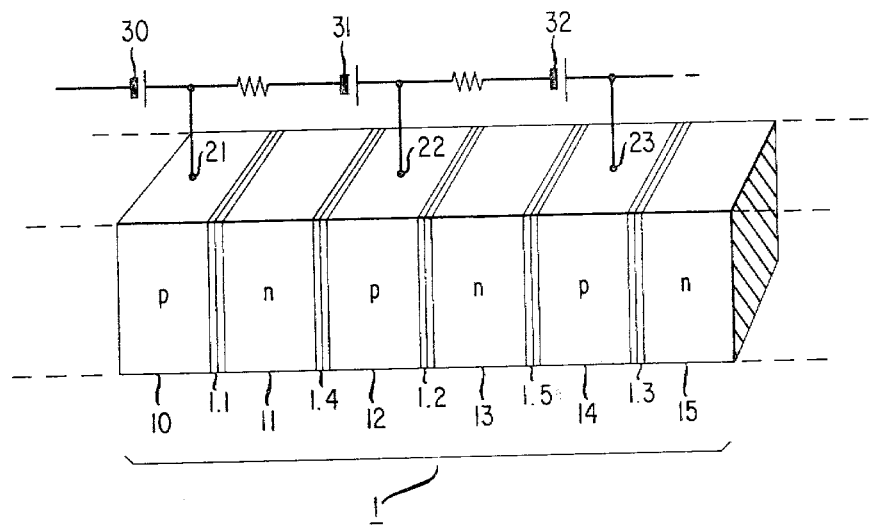
FIG. 1 shows in partially schematic, partially pictorial form an embodiment of the present invention showing three pn amplifier sections in a multi-section device.

FIG. 1 is a schematic diagram of a section of an embodiment of a multistage electron amplifying device constructed according to the present invention. The section of device 1 shown in FIG. 1 has heterojunction 1.1 at the amplifier stage formed from p layer 10 and n layer 11, heterojunction 1.2 at the amplifier stage formed from p layer 12 and n layer 13, and heterojunction 1.3 at the amplifier stage formed from p layer 14 and n layer 15. Heterojunction 1.4 is formed between n layer 11 and p layer 12 and heterojunction 1.5 is formed between n layer 13 and p layer 14. Electrode 21 is formed on p layer 10, electrode 22 is formed on p layer 12 and electrode 23 is formed on p layer 14. The energy bandgap of the material comprising p layer 12 is less than the energy bandgap of the material comprising n layer 11 and the energy bandgap of the material comprising p layer 14 is less than the energy bandgap of the material comprising n layer 13.

Figure 2:
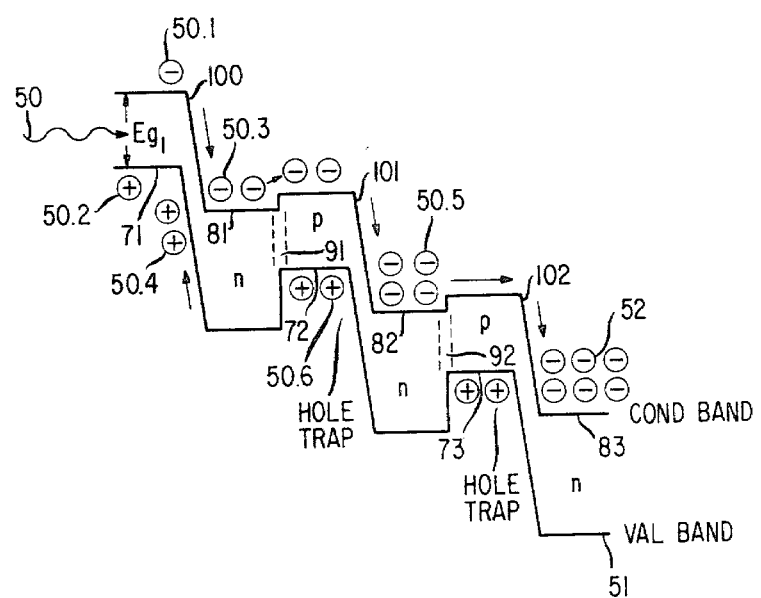
FIG. 2 shows in pictorial form the band structure for the device shown in FIG. 1 after biasing.

When voltages are applied to electrodes 21, 22 and 23 (shown illustratively as applied from batteries 30, 31 and 32 in FIG. 1) to give reverse bias to heterojunctions 1.1, 1.2 and give 1.3 and forward bias to heterojunctions 1.4 and 1.5, the electronic band structure for the section of device 1 that is illustrated in FIG. 1 takes on the shape shown in FIG. 2.

Regions 71, 72 and 73 shown in FIG. 2 correspond to p layers 10, 12 and 14 shown in FIG. 1. Regions 81, 82 and 83 correspond to n layers 11, 13 and 15 in FIG. 1.

In FIG. 2 heavy line 51 represents the energy level of the top of the valance band and heavy line 52 represents the energy level of the bottom of the conduction band in the various regions 71, 72, 73, 81, 82 and 83 of the device. Photon 50, which is incident on region 71, generates electron-hole pair 50.1 and 50.2. Electron 50.1 diffuses through region 71 toward pn junction 1.1. Electron 50.1 is then accelerated by the electric field at junction 1.1, shown as region 100 in FIG. 2, and produces new electron-hole pairs which themselves have the possibility of further production of pairs. The regions 100, 101 and 102 in FIG. 2 correspond to junctions 1.1, 1.2 and 1.3 in FIG. 1 and provide regions of acceleration for electrons. The accelerated electrons create further electron-hole pairs. For each photon absorbed in region 71, $M_1$ electrons enter region 81, and $M_1-1$ holes, shown as 50.4 in FIG. 2, plus the original hole 50.2 pass out of the device by diffusion through region 71. The bias in np heterojunction 1.4 is adjusted so that the $M_1$ electrons, shown as 50.3, proceed without serious inhibition by region 91 into region 72. These electrons diffuse through region 72 and avalanche anew when they are accelerated through pn junction 1.2, shown as region 101 in FIG. 2. In this second avalanche process each of the $M_1$ electrons 50.3 produces $M_2$ electrons in region 82, shown as 50.5 in FIG. 2, as well as $M_2-1$ holes in region 72, shown as 50.6 in FIG. 2. The barrier presented by region 81 to holes from region 72 is of sufficient magnitude as to trap them so that they cannot travel through region 81, and initiate new avalanche processes in pn junction, 1.1 shown as region 100 in FIG. 2. This trapping mechanism is responsible for the reduction in noise for the device. A similar avalanche process takes place in pn junction 1.3 shown as region 102 in FIG. 2 with the result that a total current pulse of $M_1M_2M_3$ electrons leave region 83, where $M_3$ is the amplification factor for region 102, and the unwanted avalanche multiplication of the holes has been minimized.

Electrodes 21, 22 and 23 shown in FIG. 1 serve both as means for applying the appropriate bias voltages to p layers 10, 12 and 14 and as means for removing the holes accumulated in the traps from the device. This removal of holes also helps to improve the response time of the device.

Although the discussion pertaining to FIGS. 1 and 2 concerns an electron current amplifying device, a hole current amplifying device is equally feasible when constructed according to the present invention. The particular choice as to which carrier current is chosen for amplification in a particular device is determined by choosing the carrier having the higher gain coefficient in the specific materials out of which the device is to be fabricated. It should be noted that if we were describing a device for amplifying a hole current the device would comprise a series of np heterojunctions. Here again, the bias voltages applied would give reverse bias to the np heterojunctions in the pairs of layers and give forward bias to the pn heterojunctions between the pairs of layers.

The manner in which the device shown in FIG. 1 achieves a reduction in noise is understood by referring to the following discussion.

The spectral power density of noise generated by an avalanche device is given by $2eI_{in}<n^2>$, where e is the electronic charge, $I_{in}$ is the injected current and $<n^2>$ is the mean square number of output carriers per injected carrier. Expressing $<n^2>$ as $M^2+\sigma^2$ where M is the mean and $\sigma^2$ the variance of n, the noise may be considered to have two components. The first, $2eI_{in}M^2$, is the shot noise common to all devices of the same gain M. The second, $2eI_{in}\sigma^2$, is an excess noise, and it is this noise whose reduction is the object of the present invention.

Consider a 2-stage device to consist of stage 1 and stage 2 separated by a junction which passes electrons without loss, but is blocking to holes. The multiplication and variance for the two stages are given as $M_1$, $\sigma_1^2$ and $M_2$, and $\sigma_2^2$ respectively, while the overall values for the device are $M^2$, $\sigma^2$ where $M=M_1M_2$ and $$\sigma^2 = M_1\sigma_2^2 + M_2^2\sigma_1^2. \tag{1}$$

In a 1-stage device with multiplication M, R. J. McIntyre, *IEEE Trans. Electron. Devices*, Vol. ED-13, No. 1, pp. 164–168, "Multiplication Noise in Uniform Avalanche Diodes," has shown that for electron injection $$\sigma^2 = M[(M-1) + (\beta/\alpha)(M-1)^2] \tag{2}$$

where $\beta$ is the ionization probability per unit length for holes and $\alpha$ is the same for electrons. This equation makes apparent the large noise that is generated if $\beta$ is comparable to $\alpha$.

For a 2-stage device, assuming that $\beta/\alpha$ is the same for the two stages, the variance of the device is given by $$\sigma^2 = M\{(M-1) + (\beta/\alpha)[(M_2-1)^2 + M_2(M_1-1)^2]\}. \tag{3}$$

Comparing Eq. 3 with Eq. 2 shows that the term proportional to $\beta/\alpha$ in Eq. 2 has been reduced in Eq. 3. For example, if $M_1=M_2=\sqrt{M}$, i.e., the same avalanche gain in each stage, the term proportional to $\beta/\alpha$ in Eq. 3 becomes $(\beta/\alpha)(M-1)(\sqrt{M}-1)$. The term proportional to $\beta/\alpha$ in Eq. 3 may be further minimized for fixed M by taking $2M_2=M_1^2+1$.

The generalization of Eq. 3 to describe a device comprising n stages where $\beta/\alpha$ is different for each stage is given by $$\sigma^2 = M\{(M-1) + [(\beta/\alpha)_n(M_n-1)^2 \tag{4}$$
$$+ M_n(\beta/\alpha)_{n-1}(M_{n-1}-1)^2$$
$$+ M_nM_{n-1}.....M_2(\beta/\alpha)_1(M_1-1)^2]\}.$$

Figure 3:
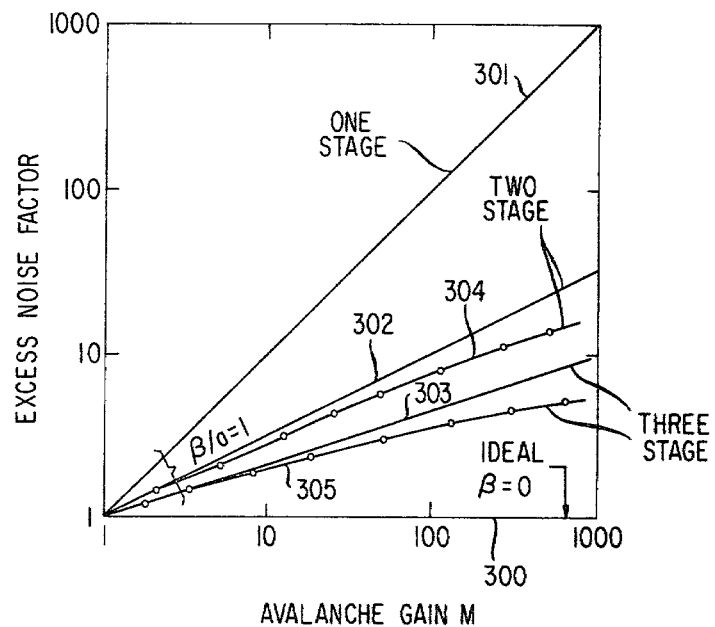
FIG. 3 shows curves of the calculated excess noise factor $\sigma^2/M(M-1)$ vs. overall avalanche gain M for 1-stage, 2-stage and 3-stage devices fabricated according to the present invention under the condition $\beta/\alpha = 1$ where $\sigma^2$ is the variance of the number of output carriers per injected carrier, $\beta$ is the ionization probability per unit length for holes and $\alpha$ is the same for electrons. The lower horizontal line represents the ideal case where $\beta = 0$.

The reduction in excess noise which may be obtained from multistage avalanche photodetectors built according to the present invention is shown in FIG. 3. The excess noise, $\sigma^2/[M(M-1)]$, has been plotted as a function of the total amplification factor M for several cases; including 2- and 3-stage devices. Horizontal line 300 in the lower part of the FIG. corresponds to the ideal case of $(\beta/\alpha)=0$, which gives the lowest excess noise obtainable in an electron multiplying photodetector.

The worst case, a single stage device with $\beta/\alpha=1$, is also shown in FIG. 3 as line 301. The FIG. shows that a 2- or 3-stage device will reduce the excess noise in the worst case, i.e., $\beta/\alpha=1$, by more than an order of magnitude to a value only several times greater than that for the ideal case. This represents a great improvement over the properties of a single stage device having the same overall gain. Curves 302 and 303 are for devices having equal gain per stage and curves 304 and 305 are for devices having gain ratios which were optimized as per the discussion hereinabove.

Although a device fabricated according to the present invention may comprise layers of different semiconductor materials it may also advantageously comprise alternating layers of as few as two materials. This feature provides for straight-forward techniques in manufacturing the device. A further ramification of this is that a device may be fabricated having an arbitrary number of amplifier stages so as to provide a high gain. Furthermore, the gain of each amplifier stage may be kept to a low value in order to improve the noise characteristics of the device.

Multilayer avalanche detectors may be prepared by epitaxially depositing lattice-matched semiconductor layers on a suitable substrate by using growth methods which are well known in the art. The layer compositions are chosen to achieve maximum gain sensitivity at a given radiation wavelength as well as to obtain a suitable electron or hole barrier. The mixed crystal combinations, GaAs/AlGaAs, GaAsSb/AlGaAsSb, GaSb/AlGaSb, and InP/InGaAsP, are examples of materials from which suitable multistage detectors might be made. Although the materials depicted illustratively above are chosen from compounds comprising elements from Groups III and V of the Periodic Table of the Elements, the devices which may be fabricated according to the principles of the present invention are not restricted to these choices. Illustratively, the devices may also be made from materials chosen from compounds comprising elements from Groups II and VI of the Periodic Table of the Elements. The particular choice of materials depends on the region of the electromagnetic spectrum which is to be detected. Examples of lattice-matched systems such as InGaAs/Ge, GaA Sb/Ge, CdTe/InGaSb and CdTe/InSbAs utilize column IV elements or II-VI compounds along with III-V compound junctions in each device. Any semiconductors having appropriate bandgaps can be used as long as the lattice match is sufficiently close that interface recombination states are minimal.

A device which can detect radiation in the infrared spectrum desired for optimizing optical communications may be fabricated using the system $In_{1-x}Ga_xAs_yP_{1-y}/In_{1-x'}Ga_{x'}As_{y'}P_{1-y'}/InP$. In the device, x and y are chosen to give the desired wavelength response to the incident radiation and x' and y' are chosen to give the desired barrier height for holes. Methods well known in the art exist for meeting these conditions. Also methods well known in the art exist for choosing the compositions of materials to insure that all layers are lattice-matched. As an example, U.S. Pat. No. 3,928,261 teaches how to grow an epitaxial layer of a quaternary III-V compound of Ga,In,As,P having its constants proportioned for lattice-matching to a substrate comprising a binary III-V compound of the elements In and P and having the constants of the alloy proportioned to provide a selected bandgap energy. The patent discloses growth of the quaternary compound on InP(111) substrates.

As a further example the following discusses a single procedure by which $In_{1-x}Ga_xAs_yP_{1-y}$ may be grown on <100> InP substrates over the entire range of lattice-matched compositions from InP to $In_{0.53}Ga_{0.47}As$. The LPE method used for this work consists of growth from a two-phase solution. Single crystal InP platelets, in excess of the quantity needed to saturate an In-Ga-As solution, are used to provide the source of P. These floating platelets eliminate the need to control exactly the small quantity of P required for saturation. They also serve a second purpose. Because the solutions are first heated much above the growth temperature, an excess amount of P is initially dissolved in the liquid. When the temperature is subsequently lowered to that used for growth, the remaining InP platelets serve as nucleation sites for the precipitation of InGaAsP, thus automatically controlling the degree of solution supercooling prior to contact with the substrate. The application of this convenient growth method extends to the entire range of lattice-matched InGaAsP/InP compositions, thus covering the complete spectral region $0.92 \leq \lambda \geq 1.54$ $\mu$m.

The growth is carried out in a quartz reaction tube under a Pd-purified $H_2$ hydrogen ambient, using a split, horizontal furnace. A multi-well graphite boat and slider arrangement is used to hold the growth solutions and to transport the InP substrate. The solutions consist of accurately weighed 99.9999 percent pure In and undoped polycrystalline GaAs and InAs, along with excess single crystal <100> InP. The liquid-encapsulated-Czochralski grown InP substrates, $0.75 \times 1.0$ cm$^2$ in area, are <100> oriented to within $\pm 0.5°$ or better. Substrate preparation includes mechanical lapping followed by chemical-mechanical polishing in 10 percent (volume) Br:methanol to a final thickness $\sim 0.25$ mm. Besides containing the solution for the quaternary layer the boat is loaded with two In/InP solutions. The first is designed for saturation at $\sim 625°$ C., and the second is prepared with excess <100> InP.

After the boat is loaded with solutions and substrate, the reactor is evacuated and flushed with $H_2$ for $\sim 1$ hour. The temperature is next increased rapidly to 675° C., and held there for 1 hour, while the In-P and In-Ga-As-P solutions become saturated from the floating InP. A cooling rate of 0.7° per minute is then established by means of an electronic controller. At $\sim 655°$ C. the substrate is transported to the first undersaturated In-P solution and held there for $\sim 15$ seconds. This allows the surface of the substrate damaged by evaporation of P during the period at 675° C. to be etched off just prior to growth. Further, to provide a smooth growth suface, an InP buffer layer is grown from the second solution in the interval 655°-636° C. At 635° C., the substrate is brought into contact with the In-Ga-As-P solution, and the quaternary layer is grown for as long as desired. The growth rate varies somewhat with the composition and is in the range 0.3-0.5 $\mu$m/°C. Prior to growth of the quaternary, its solution has tended toward equilibrium by means of the InP floating on it. The degree of residual supercooling can be controlled by adjusting the cooling rate as well as the initial saturation temperature.

Figure 5:
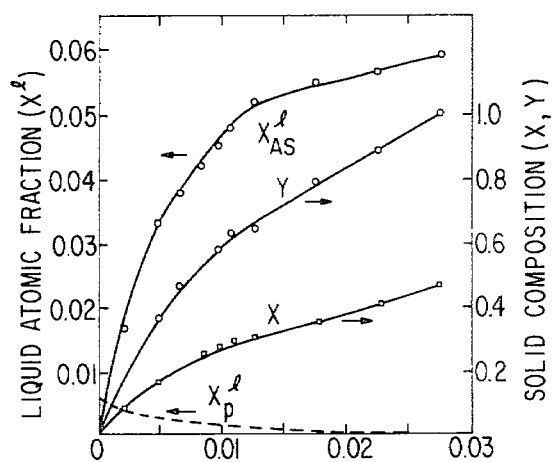
FIG. 5 is a graphical representation of liquidus and solidus data for growth of $In_{1-x}Ga_xAs_yP_{1-y}$ on <100> InP. The data show liquid atomic fractions $X_{As}{}^l$, $X_P{}^l$ and solid compositions x, y versus $X_{Ga}{}^l$ for this process. The smooth curve drawn through the $X_{As}{}^l$ vs. $X_{Ga}{}^l$ points is the locus of liquid compositions which provide lattice-matched growth.
Figure 6:
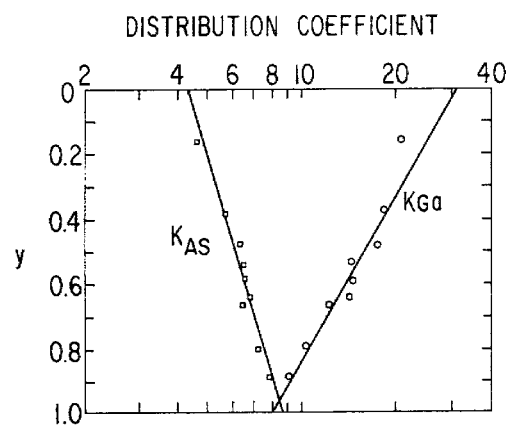
FIG. 6 is a graphical representation of distribution coefficients $k_{Ga}$ and $k_{As}$, where $k_{Ga} = x/(2X_{Ga}{}^l)$ and $k_{As} = y/(2X_{As}{}^l)$, as functions of solid composition y. An extrapolation gives $k_{Ga} \approx 8$ and $k_{As} \approx 8.5$, from which $X_{Ga}{}^l \approx 0.029$ and $X_{As}{}^l \approx 0.059$ are predicted at y=1.
Figure 7:
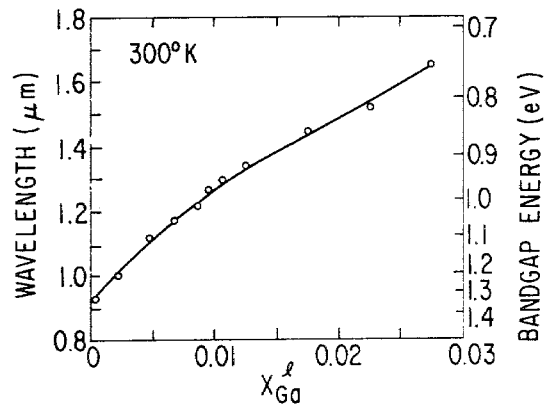
FIG. 7 shows the room temperature bandgap of the quaternary $In_{1-x}Ga_xAs_yP_{1-y}$ as a function of the liquid atomic fraction $X_{Ga}{}^l$.

In FIG. 7, the bandgap of the quaternary formed is shown as a function of $X_{Ga}{}^l$, the liquid atomic fraction of Ga. The curves in FIG. 5 represent the liquidus and solidus data for the growth process. The smooth curves drawn through the $X_{As}{}^l$ vs. $X_{Ga}{}^l$ points, where $X_{As}{}^l$ and $X_{Ga}{}^l$ are the liquid atomic fractions of As and Ga respectively, are the loci of liquid compositions giving lattice-matched growth by this method. FIG. 6 shows the Ga and As distribution coefficients, $k_{Ga} = x(2X_{Ga}{}^l)$ and $k_{As} = y/(2X_{As}{}^l)$ as functions of y. Thus, the curve in FIG. 7, together with the curves of FIG. 5 enables one to design the liquid solution necessary to grow any lattice matched $In_{1-x}Ga_xAs_yP_{1-y}$ composition at any wavelength in the range $0.92 \leq \lambda \leq 1.65$ μm.

Electrical contacts may be made to n and p layers by electroplating with Sn-Ni-Au and Au respectively.

Figure 4:
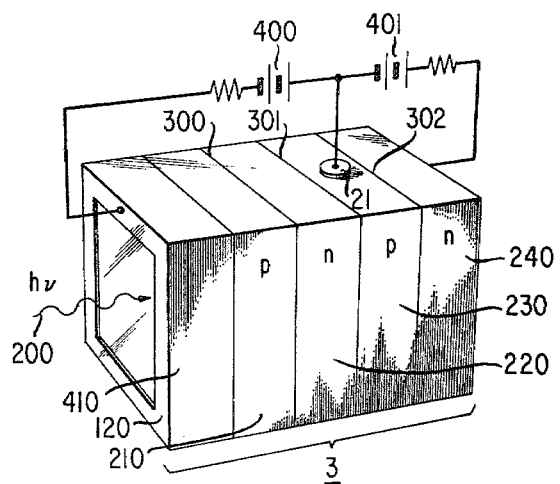
FIG. 4 shows in partially schematic, partially pictorial form an embodiment of the present invention wherein a two-stage pn-pn structure is formed on an appropriate substrate material and the structure includes means for applying an appropriate bias.

The substrates of the devices grown according to the first aspect of the present invention may serve as a window layer for the incident radiation as is shown with substrate layer 410 in FIG. 4. As an example, use of an InP substrate causes the short wavelength limit of the device to be near 0.9 μm due to the absorption edge in the InP, i.e., radiation having $\lambda < 0.95$ μm is absorbed in thick substrate windows. For some applications, it may be desirable to alter the short wavelength response of a particular detector. In the illustrative example the InP window layer may be replaced by a lattice-matched $In_{1-x}Ga_xAs_yP_{1-y}$ layer in order that the short wavelength response limit of these devices may be compositionally tuned in the same manner as the long wavelength response. These substrates may also have antireflection dielectric interference coatings placed on them to enhance the reception of radiation by the device. These coatings are well known in the art and may even be used where the incident radiation enters the device directly into a first layer of the sequence of layers.

Figure 8:
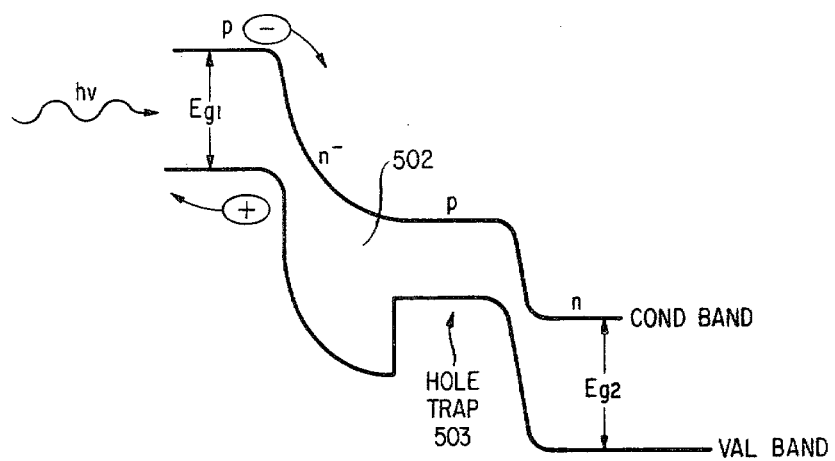
FIG. 8 shows in pictorial form the electronic band structure for a 2-stage pn—pn device constructed according to the present invention with a lightly doped floating n layer, i.e. a layer having no applied bias voltage.

FIG. 8 shows the energy level structure of a 2-stage pn-pn device constructed according to the first aspect of the present invention shown in FIG. 4 where floating n layer 220 in FIG. 4, i.e., that layer having no applied bias voltage, is doped so lightly that it is fully depleted under normal operating conditions. This means that all residual background electrons are swept out of region 502 in FIG. 8 by the applied voltage and the electric field region of heterojunction 300 extends throughout region 502. This device should have a faster response time than devices fabricated with an undepleted floating n-layer. The reason for this is because the response time of devices having an undepleted floating n-layer is affected by the manner in which the forward biased np heterojunction, junction 301 in FIG. 4, alters its electron-hole energy levels in the presence of injected electrons. With an undepleted floating n-layer, np heterojunction 301 does not allow residual electrons to flow out of n layer 220 in FIG. 4 until it has been able to adjust itself to allow injected electrons to flow across np heterojunction 301 to prevent n-layer 220 from charging. In the device having a fully depleted n-layer 220 no such self-adjustment of np heterojunction 301 is required.

Figure 9:
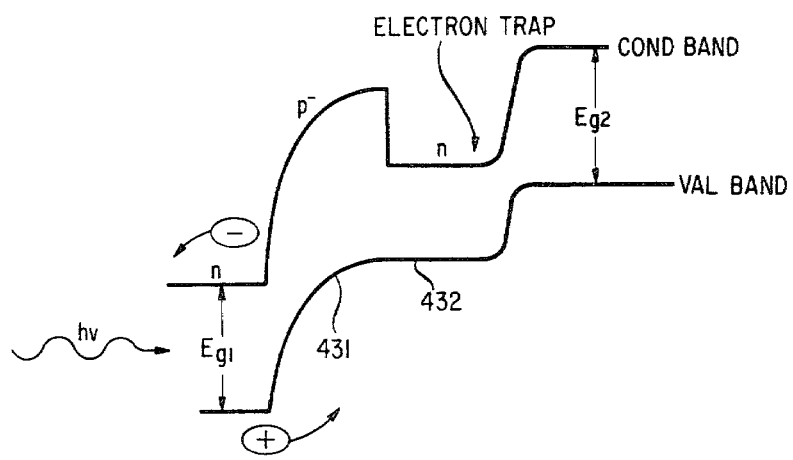
FIG. 9 shows in pictorial form the electronic band structure for a 2-stage np- np device constructed according to the present invention with a lightly doped floating p-layer.

FIG. 9 shows the energy level structure of a 2-stage np—np device constructed according to the first aspect of the present invention where region 431 corresponds to a floating p layer which is doped so lightly that it is fully depleted under normal operating conditions. The method of operation of this device is a mirror of the method of operation of a 2-stage pn—pn which has been described hereinabove. Note how region 432 becomes an electron trap for this device and is analogous to the hole trap formed for the pn—pn device shown as region 503 in FIG. 8.

I claim:

1. A reduced noise avalanche photodetector comprising:

a plurality of abutting layers of semiconductor material of alternating opposed conductivity type, said layers being grouped into a sequence of pairs of layers from a first end to a second end of said photodetector;

characterized in that:

the bandgap of the material comprising the second layer of each pair is larger than the bandgap of the material comprising first layer of the pair of layers adjacent to said second layer;

the bandgap of the first layer of at least one pair of said sequence is at least as large as the bandgap of the first layer of another pair of said sequence, which another pair is closer to said first end; and said reduced noise avalanche photodetector further includes electrode means formed on the first layer of each pair of said sequence of pairs of layers and on the second layer of the last pair of said sequence for reverse biasing the heterojunctions formed at the interface between the first layer and the second layer of each pair of said sequence and for forward biasing the heterojunctions formed at the interface between the layers from different pairs of said sequence.

2. A reduced noise avalanche photodetector comprising:

a plurality of abutting layers of semiconductor material of alternating opposed conductivity type, said layers being grouped into a sequence of pairs of layers, the first layer of each pair in said sequence comprises the same material; and the second layer of each pair in said sequence comprises the same material;

characterized in that:

the bandgap of the material comprising the first layer is smaller than the bandgap of the material comprising the second layer; and said reduced noise avalanche photodetector further includes electrode means, formed on the first layer of each pair of said sequence and on the second layer of the last pair of said sequence, for reverse biasing the heterojunctions formed at the interface between the first layer and the second layer of each pair of said sequence and for forward biasing the heterojunctions formed at the interface between the layers from different pairs of said sequence.

3. The reduced noise avalanche photodetector as defined in claim 1 wherein the second layer of at least one pair of said sequence of pairs of layers is lightly doped.

4. The reduced noise avalanching photodetector as defined in claim 2 wherein the second layer of at least one pair of said sequence of pairs of layers is lightly doped.

5. The reduced noise avalanche photodetector as defined in claim 1 wherein the materials for the first layer and the second layer from at least one pair of said sequence of pairs of layers are selected from the group consisting of quaternary compounds of InGaAsP, ternary compounds of InGaAs, ternary compounds of GaAsSb, ternary compounds of InSbAs, ternary compounds of InGaSb, binary compounds of CdTe, and Ge.

6. The reduced noise avalanche photodetector as defined in claim 2 wherein the materials for the first layer and the second layer from at least one pair of said sequence of pairs of layers are selected from the group consisting of quaternary compounds of InGaAsP, ternary compounds of InGaAs, ternary compounds of GaAsSb, ternary compounds of InSbAs, ternary compounds of InGaSb, binary compounds of CdTe, and Ge.

7. The reduced noise avalanche photodetector as defined in claim 1 wherein the materials for the first layer and the second layer from at least one pair of said sequence of pairs of layers are chosen from the group of pairs of layers consisting of $Al_{1-u}Ga_uAs/In_{1-x}Ga_xAs_yP_{1-y}$, $Al_{1-u}Ga_uAs_vSb_{1-v}/In_{1-x}Ga_xAs_yP_{1-y}$ and $InP/Al_{1-z}(In_{1-y}Ga_yAs)_z$.

8. The reduced noise avalanche photodetector as defined in claim 2 wherein the materials for the first layer and the second layer from at least one pair of said sequence of pairs of layers are chosen from the group of pairs of layers consisting of $Al_{1-u}Ga_uAs/In_{1-x}Ga_xAs_yP_{1-y}$, $Al_{1-u}Ga_uAs_vSb_{1-v}/In_{1-x}Ga_xAs_yP_{1-y}$ and $InP/Al_{1-z}(In_{1-y}Ga_yAs)_z$.

9. A reduced noise avalanche photodetector comprising:
a plurality of abutting layers of semiconductor material of alternating opposed conductivity type, said layers being grouped into a sequence of pairs of layers from a first end to a second end of said photodetector;
characterized in that:
the bandgap of the material comprising the second layer of a pair from said sequence is larger than the bandgap of the material comprising the first layer from the pair adjacent to said second layer;
the bandgap of the first layer of at least one pair of said sequence is at least as large as the bandgap of the first layer of another pair of said sequence, which another pair is closer to said first end;
a window substrate layer, for accepting incident radiation, disposed adjacent to the first pair of the pairs of layers; and
electrode means formed on said window substrate layer, on the first layer of each pair of said sequence other than the first layer of the first pair, and on the second layer of the last pair of said sequence for reverse biasing the heterojunctions formed at the interface between the first layer and the second layer of each pair of said sequence and for forward biasing the heterojunctions formed at the interface between the layers from different pairs of said sequence.

10. A reduced noise avalanche photodetector comprising:
a plurality of abutting layers of semiconductor material of alternating opposed conductivity type, said layers being grouped into a sequence of pairs of layers;
the first layer of each pair in said sequence comprises the same material; and
the second layer of each pair in said sequence comprises the same material;
characterized in that:
the bandgap of the material comprising the first layer is smaller than the bandgap of the material comprising the second layer;
a window substrate layer for accepting incident radiation, disposed adjacent to the first layer of the pair of layers from said sequence; and
said reduced noise avalanche photodetector further includes electrode means, formed on said window substrate layer, on the first layer of each pair of said sequence other than the first layer of the first pair and on the second layer of the last pair of said sequence, for reverse biasing the heterojunctions formed at the interface between the first layer and the second layer of each pair of said sequence and for forward biasing the heterojunctions formed at the interface between the layers from different pairs of said sequence.

11. The reduced noise avalanche photodetector as defined in claim 9 wherein the second layer of at least one pair of said sequence of pairs of layers is lightly doped.

12. The reduced noise avalanche photodetector as defined in claim 10 wherein the second layer of at least one pair of said sequence of pairs of layers is lightly doped.

13. The reduced noise avalanche photodetector as defined in claim 9 wherein the materials for the first layer and the second layer from at least one pair of said sequence of pairs of layers are selected from the group consisting of quaternary compounds of InGaAsP, ternary compounds of InGaAs, ternary compounds of GaAsSb, ternary compounds of InSbAs, ternary compounds of InGaSb, binary compounds of CdTe, and Ge.

14. The reduced noise avalanche photodetector as defined in claim 10 wherein the materials for the first layer and the second layer from at least one pair of said sequence of pairs of layers are selected from the group consisting of quaternary compounds of InGaAsP, ternary compounds of InGaAs, ternary compounds of GaAsSb, ternary compounds of InSbAs, ternary compounds of InGaSb, binary compounds of CdTe, and Ge.

15. The reduced noise avalanche photodetector as defined in claim 9 wherein the materials for the first layer and the second layer from at least one pair of said sequence of pairs of layers are chosen from the group of pairs of layers consisting of $Al_{1-u}Ga_uAs/In_{1-x}Ga_xAs_yP_{1-y}$, $Al_{1-u}Ga_uAs_vSb_{1-v}/In_{1-x}Ga_xAs_yP_{1-y}$ and $InP/Al_{1-z}(In_{1-y}Ga_yAs)_z$.

16. The reduced noise avalanche photodetector as defined in claim 10 wherein the materials for the first layer and the second layer from at least one pair of said sequence of pairs of layers are chosen from the group of pairs of layers consisting of $Al_{1-u}Ga_uAs/In_{1-x}Ga_xAs_yP_{1-y}$, $Al_{1-u}Ga_uAs_vSb_{1-v}/In_{1-x}Ga_xAs_yP_{1-y}$ and $InP/Al_{1-z}(In_{1-y}Ga_yAs)_z$.

17. The reduced noise avalanche photodetector as defined in claim 9 wherein said window substrate layer is an antireflection dielectric interference coating.

18. The reduced noise avalanche photodetector as defined in claim 10 wherein said window substrate layer is an antireflection dielectric interference coating.

19. The reduced noice avalanche photodetector as defined in claim 9 wherein said window substrate layer is a semiconductor material having a bandgap larger than the bandgap of the first layer of the first pair of said sequence.

20. The reduced noise avalanche photodetector as defined in claim 10 wherein said window substrate layer is a semiconductor material having a bandgap larger than the bandgap of the first layer of the first pair of said sequence.

21. The reduced noise avalanche photodetector as defined in claim 9 wherein said window substrate layer comprises an antireflection dielectric interference coating deposited on a semiconductor material having a bandgap larger than the bandgap of the first pair of said sequence of pairs of layers.

22. The reduced noise avalanche photodetector as defined in claim 10 wherein said window substrate layer comprises an antireflection dielectric interference coating deposited on a semiconductor material having a bandgap larger than the bandgap of the first pair of said sequence of pairs of layers.

* * * * *